(12) United States Patent
Hsiao et al.

(10) Patent No.: US 6,229,744 B1
(45) Date of Patent: May 8, 2001

(54) SEMICONDUCTOR MEMORY DEVICE WITH FUNCTION OF EQUALIZING VOLTAGE OF DATALINE PAIR

(75) Inventors: Chuan-Cheng Hsiao, Chia-Yi Hsien; Chih-Cheng Chen, Changhua Hsien; Hon-Shing Lau, Hsinchu, all of (TW)

(73) Assignee: Vangard International Semiconductor Corp., Hsinchu (TW)

( * ) Notice: Subject to any disclaimer, the term of this patent is extended or adjusted under 35 U.S.C. 154(b) by 0 days.

(21) Appl. No.: 09/429,402

(22) Filed: Oct. 28, 1999

(51) Int. Cl.[7] .................................................. G11C 7/00
(52) U.S. Cl. ............................................ 365/203; 365/202
(58) Field of Search .................................... 365/203, 190, 365/233, 230.08, 189.09, 205, 202, 204

(56) References Cited

U.S. PATENT DOCUMENTS 5,289,431 * 2/1994 Konishi ........................... 365/230.03
6,052,328 * 4/2000 Ternullo, Jr. et al. ................ 365/233
6,088,292 * 7/2000 Takahashi ............................ 365/233

* cited by examiner

*Primary Examiner*—David Nelms
*Assistant Examiner*—Gene N. Auduong
(74) *Attorney, Agent, or Firm*—Jiawei Huang; J. C. Patents

(57) ABSTRACT

A semiconductor memory device with a function of equalizing voltages of dataline pair. After turning off the word line and before turning on the equalization means, the datalines are precharged and discharged to a supplied voltage and ground, respectively. Using the theory of uniform distribution of charges, the datalines are equalized into VCC/2, that is, a half of the source supply voltage. The interference on a weak voltage VCC/2 generator within the equalization means during the equalization mode is thus avoided. The equalization of voltages on the dataline pair can be achieved within a transient cycle. Complete data can thus be written or read before the next command is given.

13 Claims, 1 Drawing Sheet

SEMICONDUCTOR MEMORY DEVICE WITH FUNCTION OF EQUALIZING VOLTAGE OF DATALINE PAIR

BACKGROUND OF THE INVENTION

1. Field of the Invention

The invention relates in general to a semiconductor memory device. More particularly, this invention relates to a semiconductor memory device with a function of prompt equalization of a dataline pair.

2. Description of the Related Art

According to the advancement of computer technology, the operation speed of computers is faster and faster. Apart from improving the processing speed of central process unit (CPU), the efficiency of other components in the computer has to be promoted as well. For example, in addition to the enhancement of data access speed, the controlling method of a dynamic random access memory (DRAM) has to be updated into a fast page mode and an extended data out mode, or even a synchronized DRAM (SDRAM).

In a conventional semiconductor memory device, while a pulse signal, that is, a write recovery control signal, for a write operation is triggered, the bit line pairs BL and BLB are both precharged up to a predetermined voltage. The bit lines BL and BLB are in a complementary relationship.

Under the precharging state, while any word line WL1 to WLn is selected by a row select signal, plus the column select signal and the write pulse signal are triggered, one of the dataline pair DL or DLB is pulled down to a low voltage level (normally a ground level GND). The corresponding bit line BL or BLB is also pulled down to a low level, while other bit line BL or BLB is pulled up to a high voltage level (normally a supplied voltage VCC). Thus, data can be written into a memory cell. The memory device then prepares a next write cycle according to the write recovery control signal, so that the bit lines BL and BLB are back to the precharging state.

Typically, during a read/write operation, one of the datalines DL and DLB is charged up to a high level VCC, while the other one is discharged to a low level GND. In addition, during a standby mode, both the datalines DL and DLB are precharged to a voltage of VCC/2.

Therefore, for a command of a semiconductor memory device such as an SDRAM, in the normal access operation, equalization is very crucial. An equalization command is equivalent to charging the bit line with a voltage of VCC/2.

For example, when an active command is executed, a proper word line driver is activated. The word line driver turns on the word line transistor, and charges of memory cell are then distributed to the bit line. The signal of charges on the bit line is then amplified by the bit sense amplifier. A threshold voltage of VCC/2 thus enables the bit line sense amplifier to amplify this signal to full swing within a shortest time. A read/write command is then activated. After turning off the word line, the equalization means is turned on, so that the charges on both the datalines DL and DLB can be shared thereby.

As shown in FIG. 1, a circuit diagram of a conventional memory device is illustrated. The circuit includes a memory cell array 100, a bit line sense amplifier 110, an equalization means 120 and a dataline sense amplifier 130. The memory cell array 100 is connected to the bit line sense amplifier 110 via the bit line pair BL and BLB. The equalization means 120 and the dataline pair sense amplifier 130 are connected across the dataline pair DL and DLB. The equalization means 120 is used to equalize the voltage levels of the dataline pair DL and DLB.

As described as above, after the read/write operation, the system enters a standby mode. The equalization means 120 is turned on to equalize the datalines DL and DLB, that is, the datalines DL and DLB are to share the total charges on thereon. Provided that the datalines DL and DLB reach a full swing before the aforementioned state, the total charges on the datalines DL and DLB are shared into VCC/2. Under such normal equalization mode, a weak voltage VP (=VCC/2) generator connected to the equalization means 120 can not provide a strong current force to the whole memory array, and thus is not to be damaged. The weak voltage VP generator is used to provide a required voltage (VCC/2) to the equalization means 120. However, during the equalization mode, under the circumstance that the datalines DL and DLB can not reach a full swing, that is, if the voltage of the datalines DL and DLB is higher than VCC/2, the weak voltage VP will be damaged thereby.

The conventional datalines equalization includes:

Step 1: turning off the word line.

Step 2: turning on the equalization means.

Since the memory has a very high speed of operation, the data sense amplifier 130 has only a very transient time to amplify the signal of the datalines DL and DLB. Therefore, a full swing of the signal of the dataline pair DL and DLB can not be achieved. In the above-mentioned equalization mode, the voltage of the dataline pair DL and DLB are higher or lower than VCC/2. In other words, the higher the speed of a memory circuit is, the higher the voltage of the datalines DL and DBL is. This high voltage will damage the weak voltage VP (=VCC/2) generator.

In addition, if the voltage of the dataline pair DL and DLB can not be reached during the transient equalization mode, the data read or written into the memory cell will be incomplete before the next read/write command is given.

SUMMARY OF THE INVENTION

The invention provides a semiconductor memory device with a function of promptly equalizing voltages of dataline pair. The semiconductor memory device comprises a memory cell array, a bit line sense amplifier, an equalization means, a dataline sense amplifier, an NMOS transistor and a PMOS transistor. The memory cell array is coupled to a bit line pair. Via the bit line pair, the bit line sense amplifier is coupled to the memory cell array, so as to sense and amplify the data of the bit line pair. The equalization means is connected across a pair of datalines to equalize the voltage thereof. The dataline pair comprises a first dataline and a second dataline in a complementary relationship. The dataline sense amplifier is connected between the dataline pair to sense and amplify the data thereof. The NMOS has a source region grounded, a gate to receive a first signal and a drain coupled to the first dataline. The PMOS transistor has a source region coupled to a voltage supplier, a gate to receive a second signal and a drain region coupled to the second dataline. The first signal is complementary to the second signal.

In semiconductor memory device provided by the invention, after turning off the word line (after a read/write operation) and before turning on the equalization means (equalization mode), the dataline pair is precharged and discharged to a supplied voltage and a ground source, respectively. The voltages of the datalines thus are attached to the supplied voltage and the ground to avoid damage to the weak voltage generator during the equalization mode. In the transient cycle of the equalization mode, the voltage of the datalines can be equalized promptly to avoid an incomplete read/written into the memory cell before the next command is given.

Both the foregoing general description and the following detailed description are exemplary and explanatory only and are not restrictive of the invention, as claimed.

DESCRIPTION OF THE PREFERRED EMBODIMENTS

Figure 1:
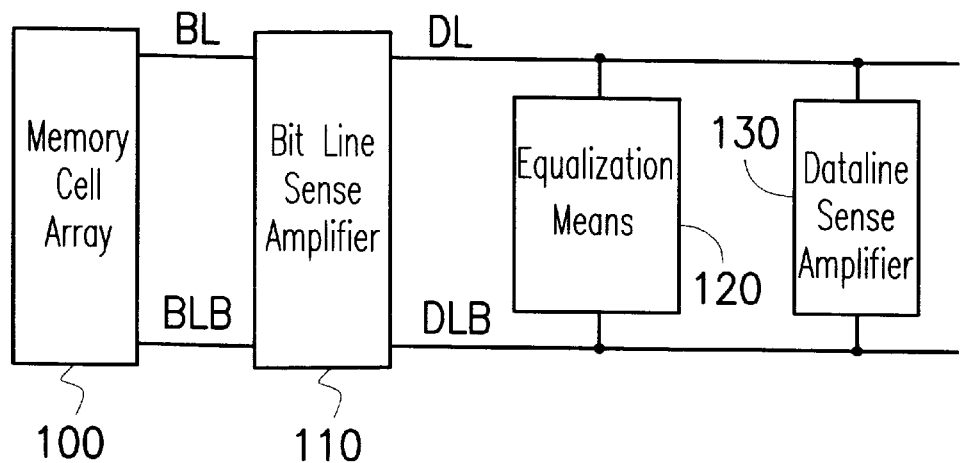
FIG. 1 shows a circuit diagram of a conventional semiconductor memory device.
Figure 2:
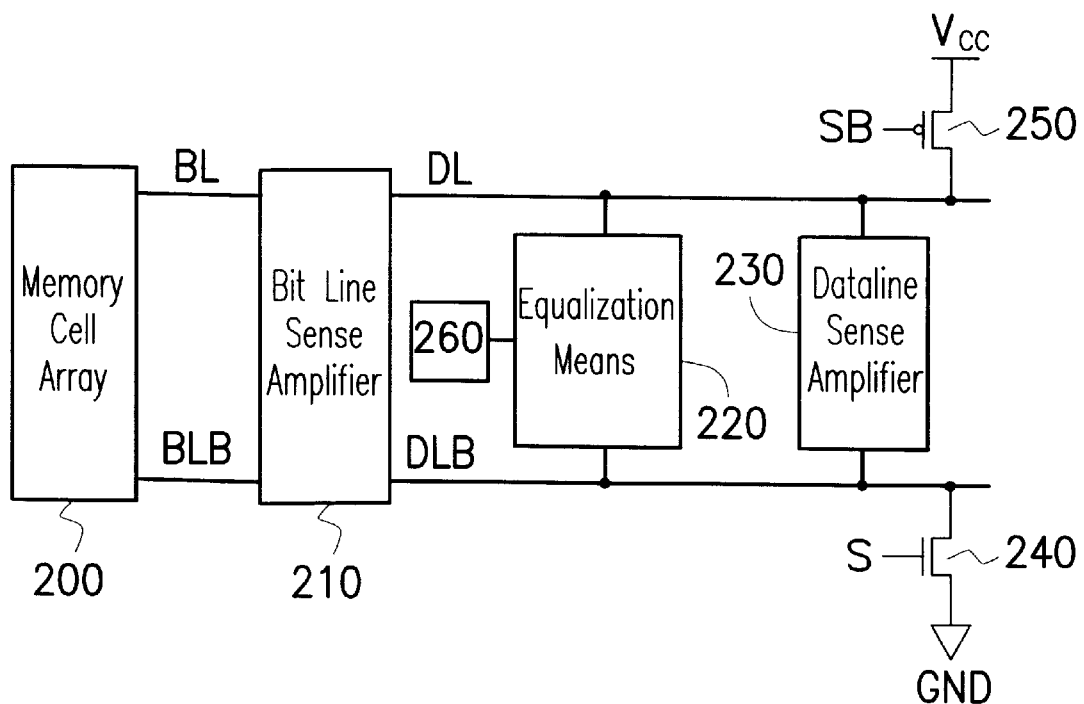
FIG. 2 illustrates a circuit diagram of a semiconductor memory device with a function of prompt equalization of dataline pair DL and DLB.

Referring to FIG. 2, a semiconductor memory device of which voltages of the dataline pair DL and DLB can be promptly equalized has a circuit diagram illustrated as shown.

In FIG. 2, the semiconductor memory device comprises a memory cell array 200, a bit line sense amplifier 210, an equalization means 220, a dataline sense amplifier 230, an NMOS transistor 240 and a PMOS transistor 250. The memory cell array is coupled to the bit line sense amplifier 210 via a pair of bit lines BL and BLB, The pair of datalines DL and DLB are connected across the equalization means 220. The bit line sense amplifier is connected to the equalization means 220 via the pair of datalines DL and DLB. The dataline sense amplifier 230 is connected across the pair of datalines to further connected to the equalization means 220. The NMOS transistor 240 has a source region connected to ground GND, a gate to receive a signal S and a drain region coupled to the dataline DLB. The PMOS has a source region coupled to the supplied voltage VCC, a gate to receive a signal SB and a drain region coupled to the dataline DL. The signals S and SB are complementary to each other. That is, when the signal S is high, the signal SB is low. On the contrary, when the signal S is low, the signal SB is high.

The invention further comprises a weak voltage VP generator 260 to provide a voltage (VCC/2) required for equalizing the datalines DL and DLB. In the invention, the NMOS transistor does not necessarily have to be grounded and the PMOS is not necessarily coupled to the supplied voltage VCC. In other words, the source region of the NMOS may be connected to the supplied voltage VCC and the source region of PMOS transistor 250 may be connected to GND.

To prevent from damaging the weak voltage VP generator, a method of precharging and discharging in advance of the equalization mode is provided. The method comprises:

Step 1: The word line is turned off. While the word line is turned on, that is, during the read/write operation, the signal S is low and the signal SB is high. The NMOS transistor 240 and the PMOS transistor 250 are off.

Step 2: After a certain period of time, precharging and discharging are performed. That is, the signal S reaches a to high while the signal SB reaches a to low. The NMOS and PMOS transistors are turned on.

Step 3: When the dataline DL is precharged (discharged) to VCC (0) and the dataline DLB is discharged (precharged) to 0 (VCC), the precharging and discharging devices, that is, the PMOS transistor 240 and the NMOS transistor 250, are turned off.

Step 4: the equalization means 220 is turned on.

In the invention, after the word line is turned off, the datalines DL and DLB are precharged and discharged to VCC and 0, respectively. The objectives of steps 2 and 3 is to ensure that the voltages of the datalines DL and DLB have approached to VCC (0) and 0 (VCC).

As shown in FIG. 2, the PMOS 250 is used to pull the dataline DL up to VCC. Thus, after turning on the equalization means 220, the dataline pairs DL and DLB start to share the charges thereof. Eventually, the voltage of the dataline DL (DLB) reaches VCC/2 which is an average voltage of the dataline pair DL and DLB.

According to the modification as mentioned above, in the invention, the voltage VCC/2 can be obtained without damaging the weak voltage VP generator.

The invention comprises at least the following advantages:

(1) After turning off the word line (after a read/write operation) and before turning on the equalization means (equalization mode), the dataline pair is precharged and discharged to a supplied voltage and a ground source, respectively. The voltages of the datalines thus are ensured to approach to the supplied voltage and the ground to avoid the interference of the weak voltage generator during the equalization mode.

(2) In the transient cycle of the equalization mode, the voltage of the datalines can be equalized promptly to avoid an incomplete read/written into the memory cell before the next command is given.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A semiconductor memory device with a function of equalizing voltages of a pair of datalines, comprising:
    a memory cell array;
    a bit line sense amplifier, connected to the memory cell array via a pair of bit lines;
    the pair of datalines, including a first dataline and a second dataline complementary to each other connected to the bit line sense amplifier;
    an equalization means, connected across the first and the second datalines;
    a dataline sense amplifier, connected across the pair of datalines to connect to the equalization means;
    an NMOS transistor, comprising a source region connected to ground, a gate to receive a first signal and a drain region coupled to the first dataline; and
    a PMOS transistor, comprising a source region connected to a supplied voltage, a gate to receive a second signal and a drain region coupled to the second dataline.

2. The semiconductor memory device according to claim 1, wherein first and the second signals are complementary to each other.

3. The semiconductor memory device according to claim 1, wherein the first signal is low and the second signal is high during a read/write operation.

4. The semiconductor memory device according to claim 1, wherein the first signal is high and the second signal is low after a read/write operation and before turning on the equalization device.

5. The semiconductor memory device according to claim 1, wherein the source region of the NMOS is coupled to the supplied voltage while the source region of the PMOS is coupled to ground.

6. The semiconductor memory device according to claim 1, wherein the semiconductor memory device comprises a synchronous dynamic random access memory.

7. The semiconductor memory device according to claim 1, further comprising a weak voltage generator to provide a voltage required to equalize the pair of datalines.

8. A semiconductor memory device with a function of equalizing a pair of datalines thereof, comprising:
   a memory cell array, coupled with a pair of bit lines;
   a bit line sense amplifier, to sense and amplify data of the bit lines;
   the pair of datalines, comprising a first dataline and a second dataline with a complementary relationship coupled to the bit line sense amplifier;
   equalization means, to equalize voltages of the first and the second datalines;
   a dataline sense amplifier, to sense and amplify data of the pair of datalines;
   an NMOS, to precharge the first dataline to a supplied voltage after a first read/write operation before turning on the equalization means; and
   a PMOS, to discharge the second dataline to a ground voltage level after a first read/write operation before turning on the equalization means.

9. The semiconductor memory device according to claim 8, wherein after the read/write operation and before turning on the equalization, the NMOS can also discharge the first dataline to a ground level while the PMOS can precharge the second dataline to the supplied voltage.

10. The semiconductor memory device according to claim 8, further comprising a weak voltage generator to provide the equalization means a weak voltage required for equalization.

11. A method of equalizing voltages of a pair of datalines of a semiconductor memory device, the method comprising:
   turning off a word line of the semiconductor memory device after a read/write cycle;
   precharging a first dataline of the pair of datalines to a supplied voltage and discharging a second dataline of the pair of datalines to a ground level; and
   turning on an equalization means of the semiconductor memory device.

12. A semiconductor memory device with a function of equalizing voltages of a pair of datalines, comprising:
   a memory cell array;
   a bit line sense amplifier, connected to the memory cell array via a pair of bit lines;
   the pair of datalines, including a first dataline and a second dataline complementary to each other connected to the bit line sense amplifier;
   an equalization means, connected across the first and the second datalines;
   a dataline sense amplifier, connected across the pair of datalines to connect to the equalization means;
   an NMOS transistor, comprising a source region connected to ground, a gate to receive a first signal and a drain region coupled to the first dataline; and
   a PMOS transistor, comprising a source region connected to a supplied voltage, a gate to receive a second signal and a drain region coupled to the second dataline, wherein the first signal and the second signal are complementary signals and the first signal is low and the second signal is high during a read/write operation.

13. A semiconductor memory device with a function of equalizing voltages of a pair of datalines, comprising:
   a memory cell array;
   a bit line sense amplifier, connected to the memory cell array via a pair of bit lines;
   the pair of datalines, including a first dataline and a second dataline complementary to each other connected to the bit line sense amplifier;
   an equalization means, connected across the first and the second datalines;
   a dataline sense amplifier, connected across the pair of datalines to connect to the equalization means;
   an NMOS transistor, comprising a source region connected to a supplied voltage, a gate to receive a first signal and a drain region coupled to the first dataline; and
   a PMOS transistor, comprising a source region connected to ground, a gate to receive a second signal and a drain region coupled to the second dataline, wherein the first signal and the second signal are complementary signals and the first signal is low and the second signal is high during a read/write operation.

* * * * *